(12) United States Patent
Lu et al.

(10) Patent No.: US 7,446,424 B2
(45) Date of Patent: Nov. 4, 2008

(54) INTERCONNECT STRUCTURE FOR SEMICONDUCTOR PACKAGE

(75) Inventors: Szu Wei Lu, Hsinchu (TW); Jerry Tzou, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 11/458,479

(22) Filed: Jul. 19, 2006

(65) Prior Publication Data

US 2008/0017956 A1 Jan. 24, 2008

(51) Int. Cl.
*H01L 29/40* (2006.01)
*H01L 23/48* (2006.01)
*H01L 23/52* (2006.01)

(52) U.S. Cl. ............... 257/783; 257/621; 257/E23.168

(58) Field of Classification Search ............... 257/676, 257/698, 773–775, 783, 621
See application file for complete search history.

(56) References Cited

U.S. PATENT DOCUMENTS

| | | | | |
|---|---|---|---|---|
| 3,343,256 A | * | 9/1967 | Smith et al. | 438/565 |
| 3,372,070 A | * | 3/1968 | Zuk | 438/504 |
| 3,648,131 A | * | 3/1972 | Stuby | 257/622 |
| 3,787,252 A | * | 1/1974 | Filippazzi et al. | 438/492 |
| 4,596,069 A | * | 6/1986 | Bayraktaroglu | 438/380 |
| 4,849,800 A | * | 7/1989 | Abbas et al. | 257/164 |
| 5,445,974 A | * | 8/1995 | Whitney | 438/123 |
| 5,528,080 A | * | 6/1996 | Goldstein | 257/741 |
| 5,618,752 A | * | 4/1997 | Gaul | 438/626 |
| 5,646,067 A | * | 7/1997 | Gaul | 438/458 |
| 5,682,062 A | * | 10/1997 | Gaul | 257/686 |
| 5,793,063 A | * | 8/1998 | Whitney | 257/107 |
| 5,814,889 A | * | 9/1998 | Gaul | 257/773 |
| 5,973,396 A | * | 10/1999 | Farnworth | 257/698 |
| 6,075,712 A | | 6/2000 | McMahon | |
| 6,459,150 B1 | * | 10/2002 | Wu et al. | 257/724 |
| 6,614,095 B1 | * | 9/2003 | Adamschik et al. | 257/621 |
| 6,861,010 B2 | * | 3/2005 | Hirabayashi et al. | 252/79.1 |
| 6,982,487 B2 | * | 1/2006 | Kim et al. | 257/774 |
| 7,088,005 B2 | * | 8/2006 | Lee | 257/783 |
| 7,157,787 B2 | * | 1/2007 | Kim et al. | 257/621 |
| 7,179,740 B1 | * | 2/2007 | Husuan | 438/667 |
| 2005/0127478 A1 | * | 6/2005 | Hiatt et al. | 257/621 |
| 2005/0161803 A1 | * | 7/2005 | Mihara | 257/698 |
| 2005/0215054 A1 | * | 9/2005 | Rasmussen et al. | 438/667 |
| 2006/0244157 A1 | * | 11/2006 | Carson | 257/787 |
| 2007/0045780 A1 | * | 3/2007 | Akram et al. | 257/621 |

OTHER PUBLICATIONS

Xintec Inc., "Wafer Level Innovative Pack", at http://www.xintec.com.tw/product/main.htm on Feb. 9, 2006, pp. 1-4.

* cited by examiner

*Primary Examiner*—David A Zarneke
(74) *Attorney, Agent, or Firm*—Duane Morris LLP

(57) ABSTRACT

A semiconductor device includes a semiconductor substrate having top and bottom surfaces, the top surface having at least one device region thereon. At least one trench opening is formed through the substrate from the bottom surface and connecting to the device region. A layer of conductive material is deposited in the at least one trench opening and partially fills the trench opening. A layer of conductive adhesive is deposited over the layer of conductive material and fills a remaining portion of the trench opening.

18 Claims, 9 Drawing Sheets

INTERCONNECT STRUCTURE FOR SEMICONDUCTOR PACKAGE

FIELD OF THE INVENTION

The present invention relates generally to semiconductor chips and more particularly to interconnect schemes for packaged semiconductor devices.

BACKGROUND OF THE INVENTION

FIG. 1 is a cross-sectional view of a prior art packaged integrated circuit 10 referred to in the art as leadless plastic chip carrier (LPCC), such as those provided by Amkor of Chandler, Ariz. LPCC 10 includes an exposed die paddle 12 coupled to a copper leadframe 14. Solder plating 16 is formed on the bottom surface of the leadframe 14. Silver plating 18 is formed over the top surface of the leadframe 14. A semiconductor die is attached to the silver plating 18 with a die attach material layer 20. Various gold wire bonds are formed between the top surface of the die and the leadframe 14, such as ground bond 22, down bond 24 and other I/O bonds 26. The structure is overmolded with a mold compound layer 28. The LPCC device is then connected to, for example, a printed circuit board (PCB) (not shown).

The LPCC 10 shown in FIG. 1 tends to suffer from high parasitic inductances, which are induced by the wire bonding, particularly when compared to flip chip bonding techniques described below. These parasitic inductances can impact device performance, particularly with high frequency RF (radio frequency) devices. The LPCC package is also larger than the flip chip package. Of particular concern, the adhesion between the die and the die pad can be poor and the wire bonding pad is easily contaminated by the thin wafer carrier de-bonding/removal process.

There is a continuing effort to increase integrated circuit speed as well as device density. As a result, new packaging schemes have been proposed for packaging complex high speed integrated circuits. One example of such as packaging technique is known as "flip chip" in the art. Various flip chip techniques are described in, for example, U.S. Pat. No. 6,075,712 to McMahon, the entirety of which is hereby incorporated by reference. Flip chip techniques have high package costs and device performance can be improved.

An improved packaging and interconnect scheme are, therefore, desired.

SUMMARY OF THE INVENTION

A semiconductor device includes a semiconductor substrate having top and bottom surfaces, the top surface having at least one device region thereon. At least one trench opening is formed through the substrate from the bottom surface and connecting to the device region. A layer of conductive material is deposited in the at least one trench opening and partially fills the trench opening. A layer of conductive adhesive is deposited over the layer of conductive material and fills a remaining portion of the trench opening.

In another embodiment the semiconductor device substrate includes at least one dummy trench opening formed at least partially through the substrate from the bottom surface and a leadframe. An adhesive layer is disposed between the bottom surface of the substrate and the leadframe.

A semiconductor package assembly is also provided including a first chip having a first semiconductor substrate having top and bottom surfaces, the first surface having at least one device region, at least one trench opening connecting to the device region through the semiconductor substrate and having at least one layer of conductive material deposited therein, and at least one dummy trench defined in the semiconductor substrate. A leadframe is coupled to the first chip with a layer of conductive material. A second chip is disposed over the first chip and electrically couples to the leadframe through the first chip.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
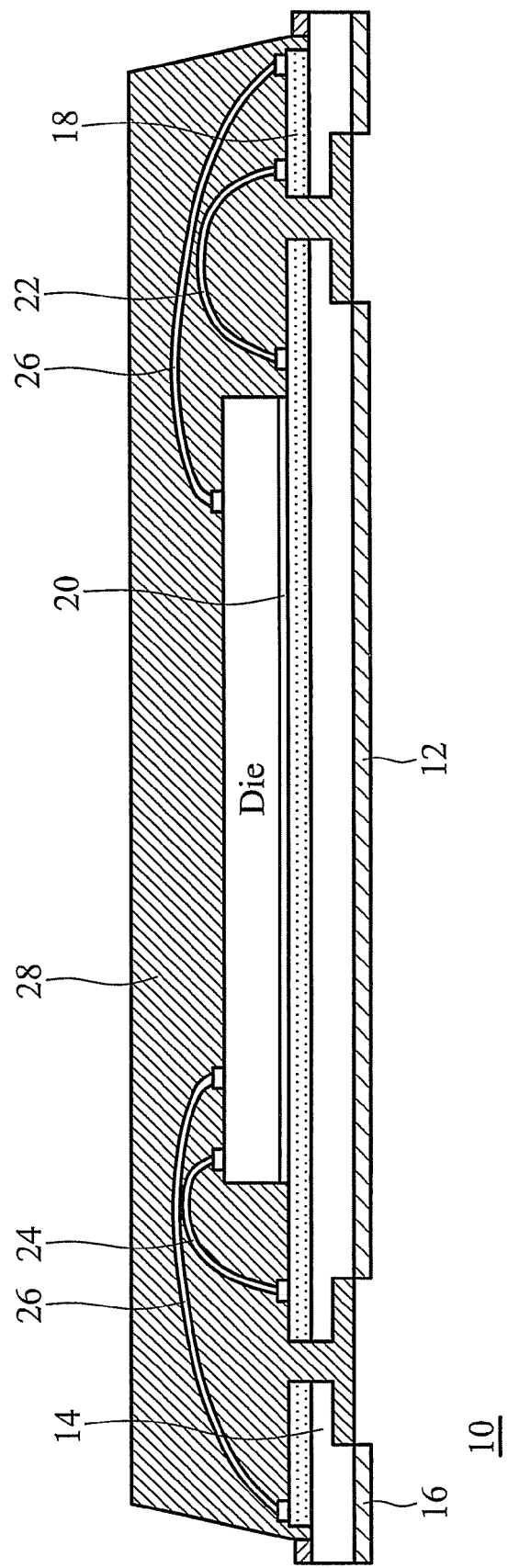
FIG. 1 is a cross-sectional view of a prior art leadless package chip carrier device.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
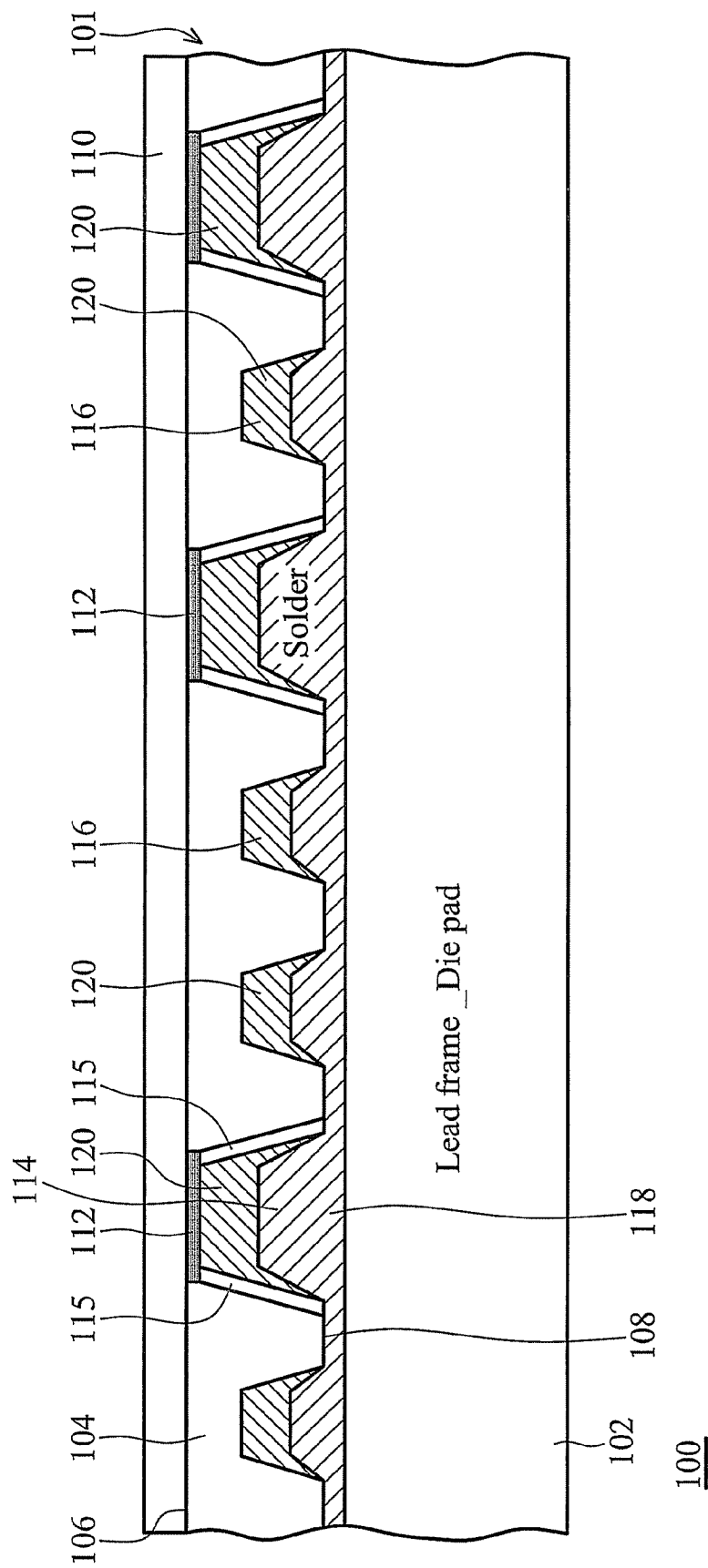
FIG. 2 is a cross-sectional view of a first embodiment of an integrated circuit-leadframe assembly.

FIG. 2 is a partial cross-sectional view of an embodiment of an improved semiconductor device 100. The device includes a conductive substrate, die pad or conventional metal leadframe 102 (collectively hereafter referred to as "leadframe") coupled to a semiconductor die 101. The semiconductor die 101 includes a semiconductor substrate 104 having top and bottom surfaces 106, 108, respectively. As those in the art will understand, the semiconductor substrate 104 forms a part of an integrated circuit. The active or device regions (not shown) of the integrated circuit are formed within the topside surface 106 of the semiconductor chip substrate 104. The chip substrate preferably comprises a silicon substrate although other semiconductor substrates, such as a silicon-germanium substrate, a III-V compound substrate, or a silicon on insulator (SOI) substrate may be utilized in embodiments. An interconnect or metallization structure 110, including interconnects (i.e., conductive lines), connecting vias and inter level dielectric layers (ILDs), is provided over the top surface 106 of the substrate over the device region. Those in the art are familiar with the structure and techniques for forming interconnect structure 110. The interconnect structure often includes multiple levels of interconnects, such as metal one (M1) to metal nine (M9), formed between the device layer and the passivation/bonding structure (not shown). The metallization can comprise Al, AlCu, Cu, W or other conductive materials.

The semiconductor device 100 includes at least one, and preferably several, trenches 114 formed through the substrate 104 from the bottom surface 108 to the device region. In the illustrated embodiment, the trench 114 extends to the first metallization layer M1 (labeled 112) of the interconnect structure 110. A barrier layer 115, such as TiN, may be formed on the side wall of the trench 114. The trench 114 can, for example, take the place of a wire bond connecting the device region to a ground connection of the leadframe though other connections are contemplated. A conductive layer 120, which preferably comprises copper or AlCu (collectively, "copper" or "Cu") is deposited to at least partially fill the trench 114. In a preferred embodiment, the conductive layer 120 only partially fills the trench 114. An adhesive layer 118 is provided between the bottom surface 108 of the substrate 104 and the leadframe 102. In one preferred embodiment, the adhesive layer is a conductive solder that bonds the leadframe to the substrate 104 and electrically couples the leadframe 102 to the device region through trench 114. Examples of conductive solder materials include SnPb and SnAgCu though other conductive pastes, such as a past comprising Ag, can be used.

As also shown in FIG. 2, the device 100 preferably includes at least one, and preferably several, dummy trenches 116. By "dummy" it is meant that the trenches are provided for their structural or mechanical, as opposed to electrical, functionality. Exemplary dummy trenches 116 are preferably formed only partially through the substrate 104, though in embodiments the trenches could be formed completely through the substrate if coupled to corresponding dummy regions of the device region, such as a field oxide or other isolation region. In one embodiment, conductive layer 120 also partially fills dummy trenches 116.

The conductive adhesive layer 118 preferably comprises a solder and partially fills both trench regions 114 and dummy trench regions 116, making contact to copper layer 120. The improved roughness of the bottom surface of the substrate 104 (through the increased surface area provided by trenches 114, 116) and the bond between the copper layer 120 and the solder layer 118 provides a very robust bond between the leadframe 102 and the substrate 104, which is not otherwise provided by an adhesive bond formed between a planar substrate bottom surface and a leadframe of the prior art.

Partially filling the trenches with layer 120 offers several benefits. For example, electroplating processes for depositing copper are time consuming and add costs to the fabrication process. Reducing the thickness of layer 120, therefore, reduces the time and cost of the process. Further, it is believed that a thick layer of copper plated onto the bottom surface 108 of the semiconductor substrate 104 would have to be thinned or removed before a robust, highly effective bond could be achieved with adhesive layer 118.

In an exemplary embodiment, trenches 114 have a diameter of around 50 μm and dummy trenches 116 have a diameter of about 30 μm or less. Assuming the wafer 104 has a thickness of about 200 μm, exemplary dummy trenches 116 have a depth from the bottom surface 108 of between about 30-190 μm, and more preferably 50-150 μm. In one embodiment, also assuming the wafer has a thickness of about 200 μm, the copper layer 120 has a thickness of about 100 μm. Dummy trenches can improve the bond to the leadframe as the copper/solder bond is stronger than the silicon/solder bond.

Figure 2A:
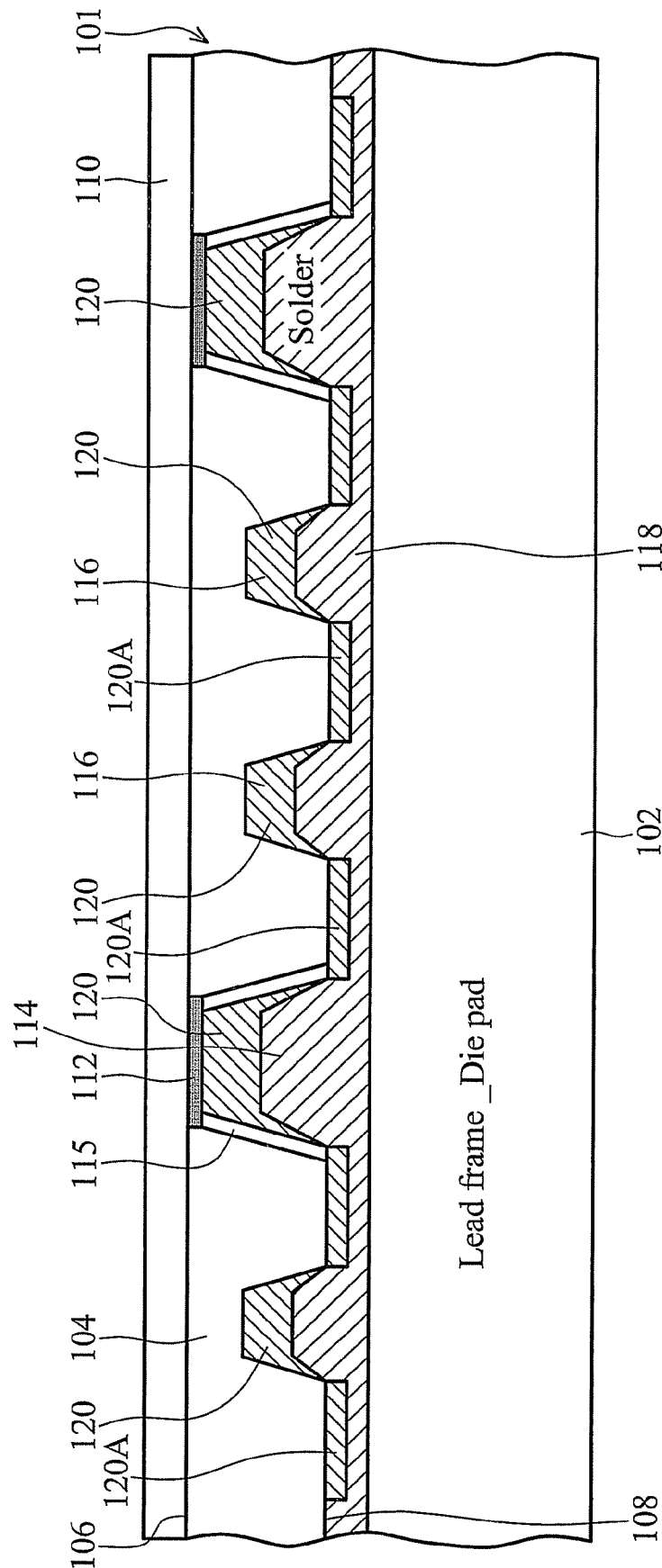
FIG. 2A is a cross-sectional view of a second embodiment of an integrated circuit-leadframe assembly.

FIG. 2A is an alternative embodiment of the device 100 of FIG. 2. The device 100A is identical to the device 100 of FIG. 2 except that conductive layer 120A is also provided on the bottom surface 108 of the substrate. In this embodiment, the solder layer 118 bonds to the conductive layer 120 within the trenches 114, 116 and to the conductive layer 120A formed over the bottom surface 108 of the substrate 104. Conductive layers 120 and 120A are formed at the same time and preferably comprise electroplated copper.

An exemplary method of forming the structures of FIGS. 2 and 2A is now described. A wafer substrate is provided, such as a silicon substrate 104. In one embodiment, the substrate has an initial thickness, such as 800 μm, and the wafer is polished, ground or etched to a desired thickness, such as to a thickness between about 100-200 μm. Next, trenches are formed using MEMS (micro-electro-mechanical system) technology or by etching, laser or other drilling process. Three kinds of vias or trenches can be formed in this process—dummy trenches 116, through via trenches 114 for ground or other connections and through vias for I/O connections, which are discussed in more detail below in connection with FIGS. 4 and 4B. After via/trench formation, a thin seed layer of copper, nickel or other appropriate seed layer is deposited over the bottom surface of the substrate and the trenches. A copper electroplating process is then performed to partially fill the trenches/vias, though in embodiments the vias could be completely filled. After the copper plating formation step, in the formation of the device of FIG. 2 (as opposed to FIG. 2A), the backside copper is removed from the bottom surface of the substrate using, for example, a CMP (chemical mechanical polish) process. After removal of the copper layer from the backside of the substrate, solder paste optionally is printed into the vias, such as when the via is too deep to fill by only applying solder paste on the leadframe. An individual die is sawed or cut from the substrate wafer. Solder paste is then applied to the leadframe and or bottom surface of the substrate. Finally, the substrate (e.g., an individual die or dies) is mounted onto the leadframe, preferably with the solder partially filling the trenches to contact the copper layer. Any necessary wire bonds are connected to the I/O of the device. The structure is then overmolded with a packaging material and cut to form individual packaged chips.

Figure 3:
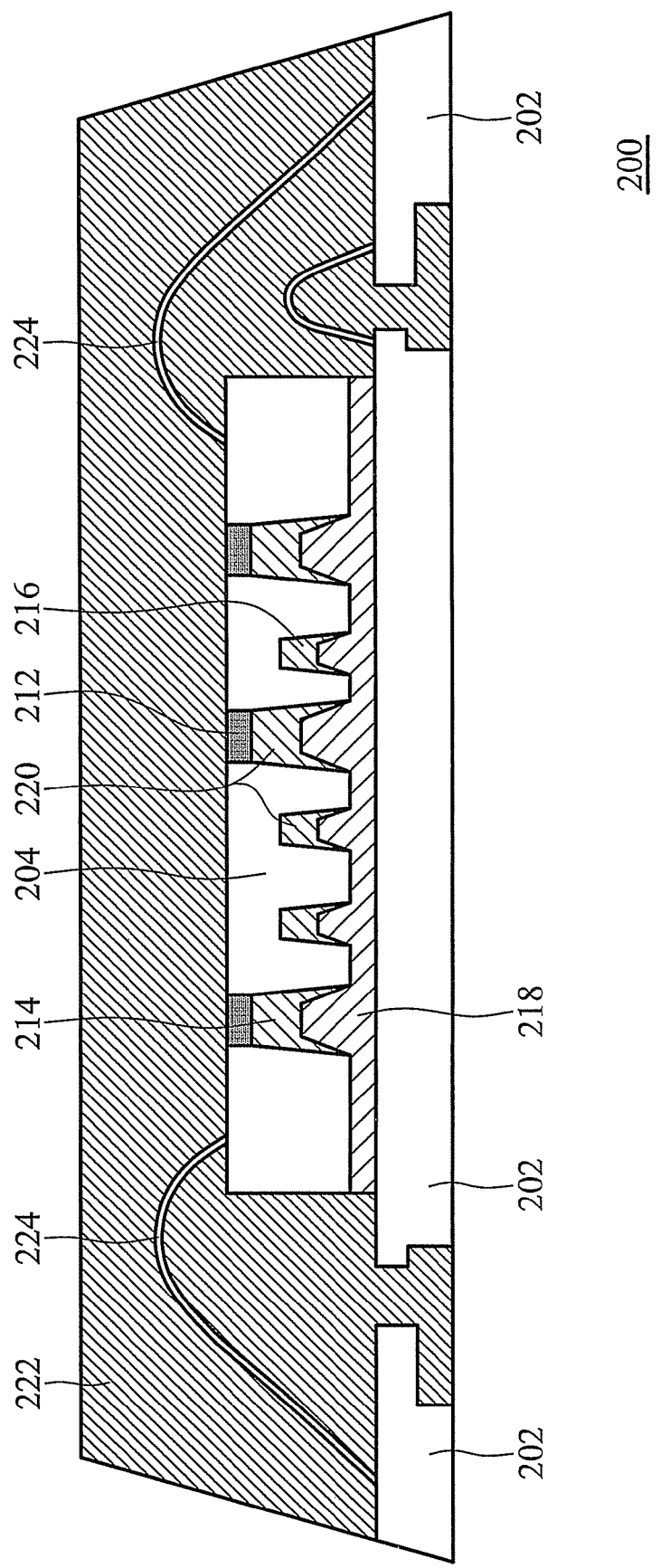
FIG. 3 is a cross-sectional view showing the assembly of FIG. 2 encapsulated in a packaging material.

FIG. 3 is a cross-sectional view showing the device structure of FIG. 2 packaged within a packaging layer 222 to form packaged device 200. Packaging layer 222 comprises a molding compound formed over the device in a molding process. As can be seen from FIG. 3, the packaged device 200 includes leadframe 202 coupled to a substrate 204 with adhesive solder material layer 218. Copper layer 220 partially fills through trenches 214 and dummy trenches 216. Trenches 214 electrically couple a portion of the leadframe 202 to the device layer, specifically to M1 layer 212, formed within the top surface of the substrate 204. Wire bonds 224 couple I/O regions, such as bond pads, formed over the top surface of the substrate 204, specifically over the interconnect region (not shown) thereof, to respective I/O portions of the leadframe 202.

Although embodiments are described above having both conductive trenches 114 and dummy trenches 116 in certain embodiments, only dummy trenches 116 are provided. For example, dummy trenches could be provided to the prior art embodiment of FIG. 1 to improve the bond between the leadframe and the substrate. In this embodiment, the trenches are preferably, but not necessarily, partially filled with a material, such as copper, that provides an improved bond with the adhesive layer when compared with the bond between the substrate bottom surface and the adhesive layer. When only dummy trenches are used, the filling material and adhesive layers need not be conductive. However, when the adhesive material is formed into both conductive and dummy trenches, a conductive material is used. As described above, a partial fill is still preferred to improve the bonding surface for the adhesive layer. It is even contemplated that the adhesive layer may completely fill the dummy trenches and the second material may be eliminated or vice versa.

Still further, in embodiments, the dummy trenches 116 may be omitted, leaving connection trenches 114. In this embodiment, it is still preferred that the conductive layer 120 only partially fill the trenches 114, providing a roughened substrate surface for a robust bond with the conductive adhesive layer 118.

Figure 4:
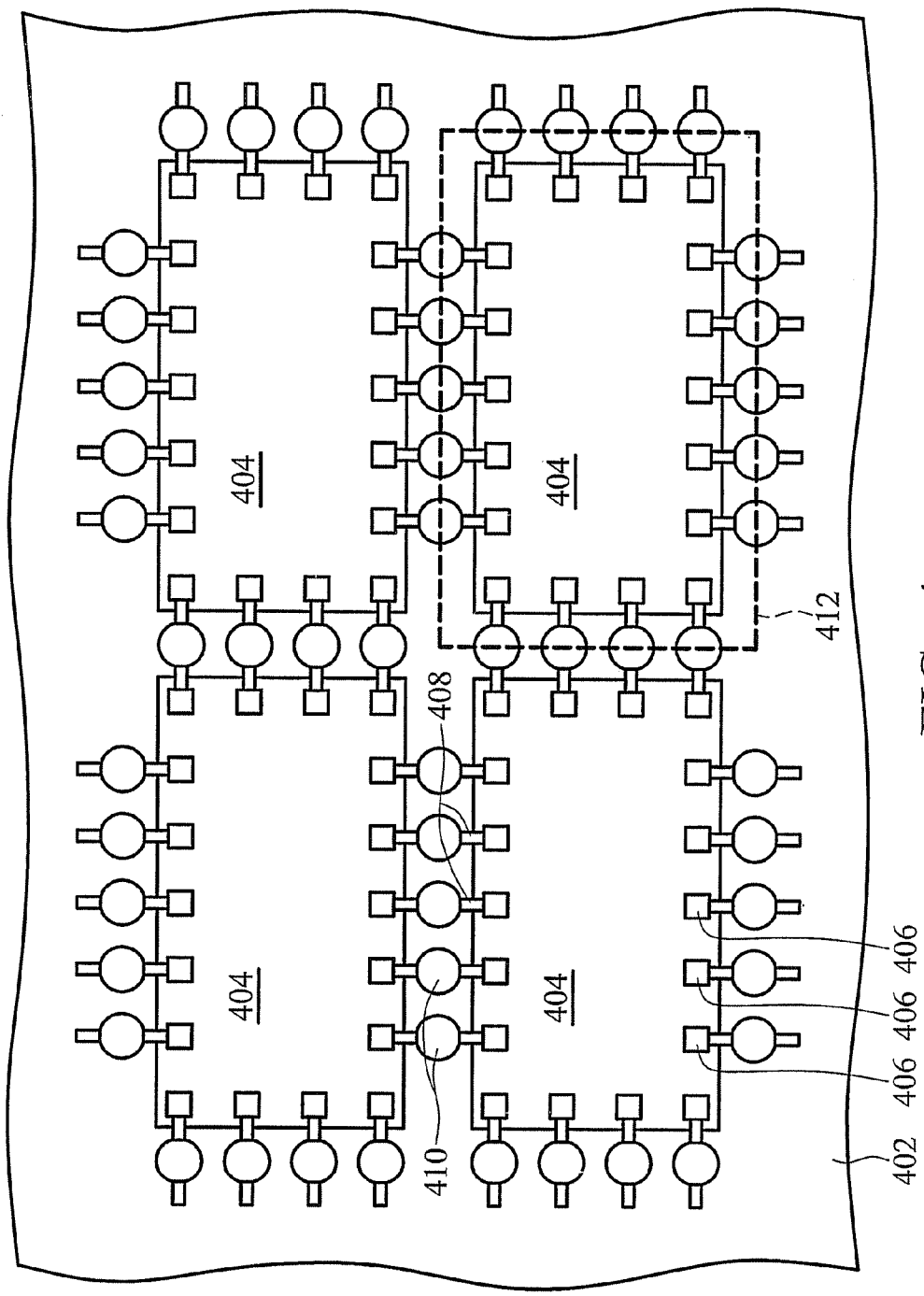
FIGS. 4-4B illustrate a third embodiment of an integrated circuit-leadframe assembly and method of making the same.
Figure 4A:
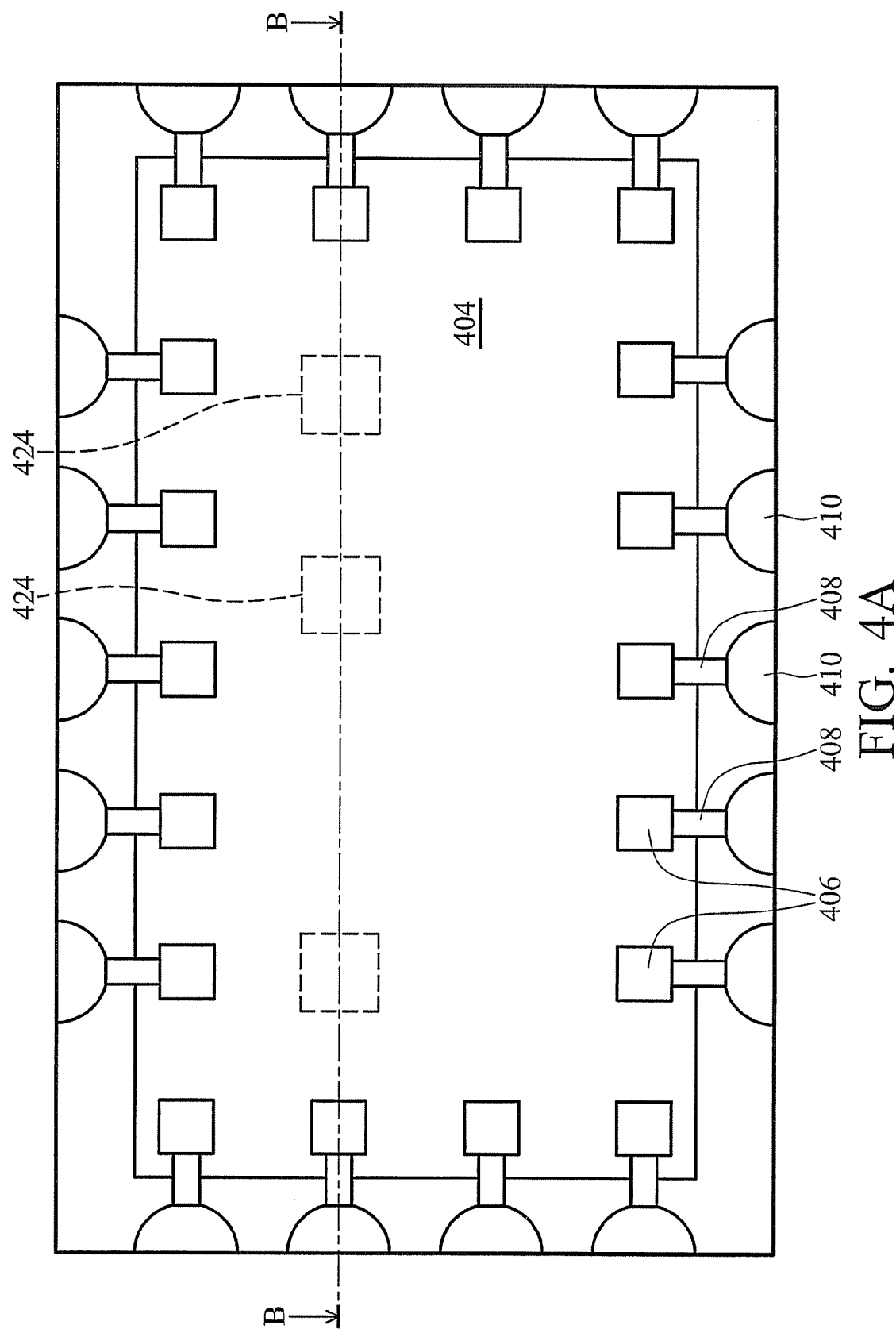
Figure 4B:
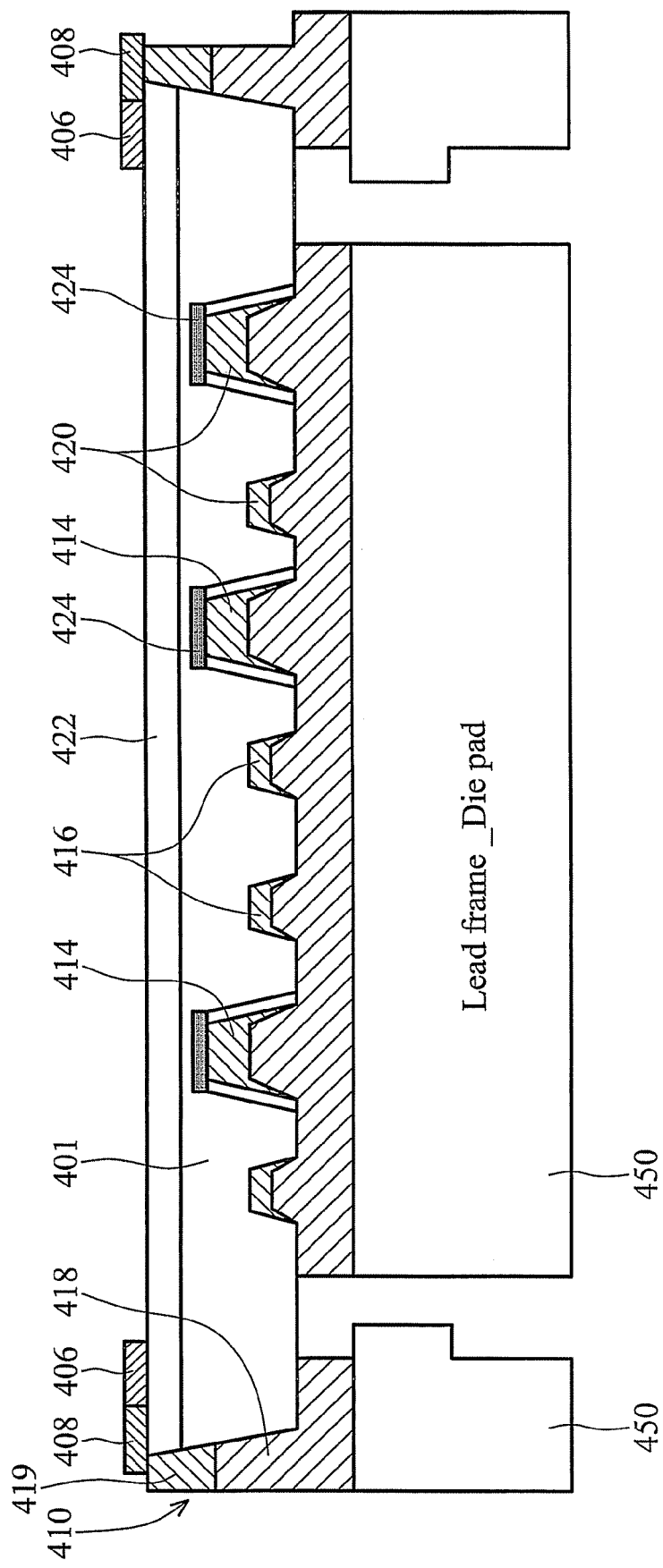

FIGS. 4-4B illustrate a third embodiment of the improved integrated circuit structure and a method of manufacturing the same where I/O bond wires are replaced with conductive through vias. FIG. 4 shows a top surface view of a portion of a semiconductor wafer 402. The wafer 402 includes a number of discrete device regions 404 formed in the top surface of the wafer 402. The surrounding areas of the substrate typically have an isolation structure, such as a field oxide, formed thereover. Respective interconnect structures are formed over the device regions 404 along with a passivation structure. I/O bond pads 406, typically formed of copper are formed in or on the passivation structure and make electrical contact to the interconnect structure. I/O through holes 410 are drilled or otherwise formed adjacent the I/O bond pads 406 completely through the wafer and any isolation and/or passivation structure formed thereover. In one embodiment, the diameter of through holes 410 is between about 10-100 µm. As discussed below, the through holes are filled with a conductive plug of one or more conductive layers and make electrical contact to lines 408. Though not show from the top view, trenches and dummy trenches are also formed as discussed above. Thin film copper or Al redistribution lines 408 are formed to electrically connect the I/O holes 410 to the I/O pads 406. Line 412 represents a scribe line where an individual chip will be cut from the wafer for subsequent coupling to a leadframe and packaging.

FIG. 4A is a top view of an individual chip that has been cut or sawed from the wafer 402 of FIG. 4 along scribe line 412. FIG. 4B is a cross-section of the chip of FIG. 4A taken along lines B-B and showing its connection to leadframe 450. Turning to FIG. 4B, the chip of FIG. 4A is shown connected to leadframe 450 using adhesive layer, e.g. solder paste, 418. As can also be seen from FIG. 4B, the substrate 401 includes trenches 414 and dummy trenches 416, which are partially filled with conductive layer 420. Interconnect layer 422, M1 layer 424 (which is also shown in phantom in FIG. 4A), I/O pads 406, and redistribution lines 408 are also shown. I/O through vias 410 are preferable partially filled with conductive layer 419 and conductive adhesive layer 418 to form a conductive plug I/O connection to respective I/O portions of the leadframe 450. In one embodiment, conductive layer 419 is formed at the same time as conductive layer 420 and comprises copper. Finally, FIG. 5 is a cross-sectional view of the device of FIGS. 4A and 4B encapsulated within a packaging material 460, thereby forming a finished packaged chip.

From the foregoing, it can be seen that the conductive through vias 410 have replaced the I/O bond wires shown in FIG. 1 and FIG. 3 and described above. This embodiment not only enhances the adhesion between the die and the die pad by increasing the wafer backside roughness, in addition to the other benefits associated with the embodiments of FIGS. 2 and 2A, but also increases the electrical performance, eliminates any wire bond problems due to bond pad contamination arising from removal of the thin wafer carrier and allows for smaller sized chips.

Figure 5:
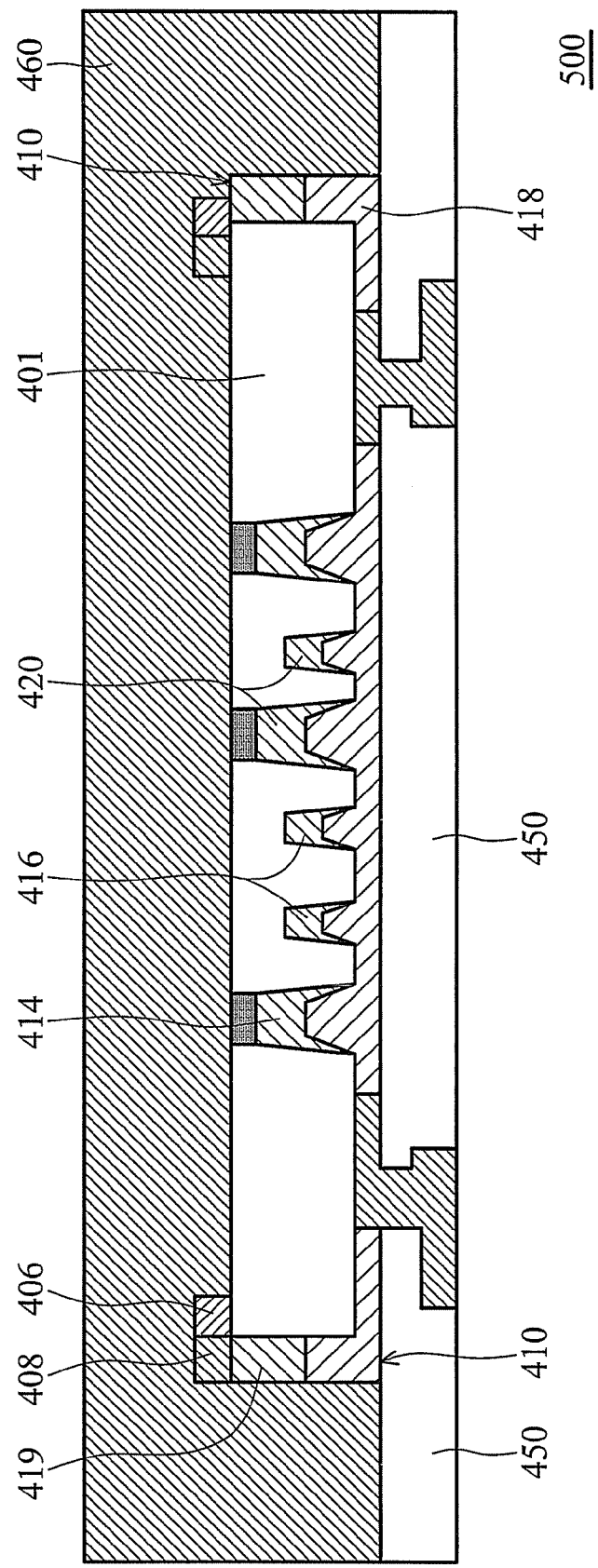
FIG. 5 is a cross-sectional view showing the assembly of FIGS. 4A and 4B encapsulated in a packaging material.

An exemplary method of forming the device of FIG. 5 is now briefly described. After formation of the device regions 404 in the substrate 402 and interconnect layers thereover, the passivation structure and I/O bond pads 406 are formed, along with the redistribution lines 408. I/O through vias are formed and filled with a conductive material, such as described for conductive layer 420 (e.g., copper). The top side of the wafer is then mounted to a wafer carrier, such as a glass substrate, after which it is ground to the desired thickness. The trenches 414, dummy trenches 416 and I/O vias 410 are then formed using MEMS techniques familiar to those in the art, followed by copper or nickel seed layer sputtering. Copper layers 419/420 are then plated onto the bottom surface of the substrate, preferably to partially fill the trenches 414, 416 and through vias 410. The solder paste 418 is then preferably applied to the leadframe 450 and optionally printed into the vias. The wafer carrier is then removed and the wafer is sawed to singulate die. Individual die chips are then mounted to the leadframe 450 using the solder paste 418. The chips and leadframe assembly is then overmolded and singulated to form packaged chips.

Figure 6:
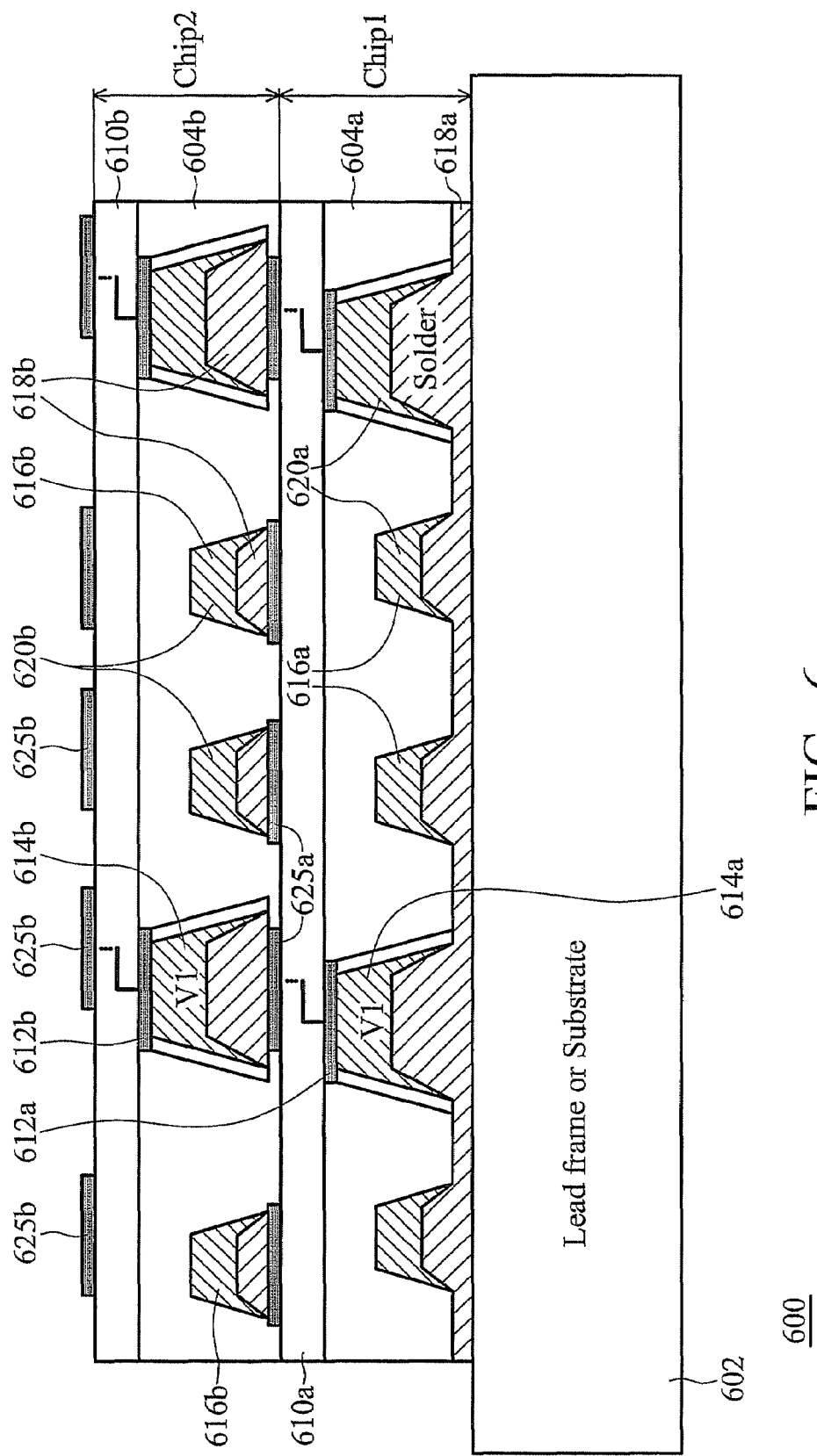
FIG. 6 is a cross-sectional view of an integrated circuit-leadframe assembly including a plurality of device layers.

FIG. 6 illustrates that the trench and dummy trench structures described above can also be utilized in the creation of three dimensional integrated circuits. Three-dimensional integration refers to any process by which multiple conventional device layers may be stacked and electrically interconnected. Three dimensional integration provides benefits in terms of wire length, area, timing and energy consumption. FIG. 6 shows a stack 600 of chips. Although only two chips are shown, it should be understood that two or more chips may be stacked as dictated by the design. The stack 600 includes a common leadframe 602 and a first chip coupled to the leadframe 602 as described above using a solder material 618a. The first chip includes a substrate 604a, as described above, having trenches 614a and dummy trenches 616a partially filled with conductive layer 620a. Interconnect layer 610a is formed over the top surface of the substrate 604a. The trenches 614a and conductive material therein electrically couple the leadframe 602 to the device layer of the first chip via M1 layer 612a.

Like the first chip, the second chip includes a substrate 604b having trenches 614b coupled to M1 layer 612b, dummy trenches 616b, conductive layer 620b, interconnect layer 610b, and conductive adhesive solder layer 618b. Unlike solder layer 618a, solder layer 618b preferably does not cover the entire bottom surface of the second chip. Rather, the solder layer is essentially limited to the trench regions and is coplanar with the bottom surface of the substrate 604b using printing techniques familiar to those in the art. The solder layer 618b formed in the trench regions 614b, 616b is coupled to bond pads 625a of the first chip, creating a structural bond between the dummy trenches 616b and the first chip and a structural and electrical bond between the trenches 614b and the first chip, and thus the leadframe. Conductive bond pads 625a preferably comprise copper or aluminum and are formed over the interconnect layer 610a. In this way, an electrical connection between chips one and two can be made to the leadframe 602, such as for a ground connection. As should be understood, the bond pads 625a that are connected to dummy trenches 616b can be dummy bond pads, i.e., pads that are electrically isolated from the interconnects of the interconnect structure 610a.

The bond pads 625b that are formed over interconnect structure 610b can be used in making connections (electrical and structural) to subsequent chips added to the stack 600 or to bond wires (not shown) connecting the second chip to the leadframe 602. The structure of FIG. 600 is then encapsulated to form a packaged product.

As described above, the new interconnect structure enhances the adhesion between the die and die pad by increasing the wafer backside roughness while providing a smaller form factor (i.e., package size) to RF devices for high Q packages. Heat spreader layers cannot be used for wire bonded packages. Therefore, the packaging technique allows for better heat dispersion because a heat spreader layer can be used with the package. Further, the scheme does not suffer from any wire bond pad contamination issues, while allowing for chip sizes that are smaller than those provided by flip chip.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A packaged semiconductor device, comprising:
    a singulated integrated circuit die comprising a semiconductor substrate having top and bottom surfaces, said substrate comprising an integrated circuit formed in a device region at said top surface;
    a plurality of trench openings formed through said substrate from said bottom surface, at least one of said trench openings connecting to said device region;
    a layer of conductive material deposited in said trench openings and partially filling said trench openings;
    a conductive leadframe coupled to a bottom surface of said substrate with a substantially continuous layer of conductive adhesive, said layer of conductive adhesive formed over said layer of conductive material and filling a remaining portion of said trench openings, said layer of conductive adhesive forming a substantially continuous adhesion interface between the bottom surface of said substrate and an opposing mating surface of said conductive leadframe; and
    a packaging material overmolded onto said singulated integrated circuit die and leadframe.

2. The semiconductor device of claim 1, wherein said layer of conductive material comprises copper and said layer of conductive adhesive comprises solder or a conductive paste comprising Ag.

3. The semiconductor device of claim 1, wherein said plurality of trench openings comprises at least one dummy trench opening formed at least partially through said substrate from said bottom surface, wherein said layer of conductive material partially fills said dummy trench opening, said layer of conductive adhesive filling a remaining portion of said dummy trench opening.

4. The semiconductor device of claim 3, wherein said dummy trench is formed only partially through said substrate.

5. The semiconductor device of claim 1:
    wherein the integrated circuit comprises an interconnect structure having a plurality of levels of metallization formed over said device region and at least one bond pad formed over said interconnect structure and electrically coupled to said at least one trench opening through said interconnect structure, said semiconductor device further comprising:
    a second integrated circuit die comprising a second semiconductor substrate having top and bottom surfaces, said second substrate comprising a second integrated circuit formed in a device region at the top surface, said second semiconductor substrate disposed over said interconnect structure;
    at least one trench opening formed through said second semiconductor substrate from said bottom surface and connecting to said second semiconductor substrate device region; and
    a second layer of conductive material deposited in said at least one trench opening formed through said second semiconductor substrate,
    wherein said bond pad is electrically coupled to said second layer of conductive material.

6. The semiconductor device of claim 5, further comprising a second layer of conductive adhesive disposed between said bond pad and said second layer of conductive material.

7. The semiconductor device of claim 6, further comprising at least one dummy trench formed at least partially through said second semiconductor substrate, said second layer of conductive adhesive at least partially filling said at least one dummy trench.

8. The semiconductor device of claim 1, wherein the integrated circuit comprises an interconnect structure comprising a plurality of levels of metallization formed over said device region, wherein said layer of conductive material is electrically coupled to said interconnect structure.

9. The semiconductor device of claim 1:
    wherein the integrated circuit comprises an interconnect structure having a plurality of levels of metallization formed over said device region;
    the semiconductor device further comprising a vertical conductive line formed outside of said device region through said substrate, said conductive line electrically coupling an I/O portion of said leadframe to a portion of said interconnect structure, and a horizontal conductive line formed over said interconnect structure and coupling said interconnect structure to said vertical conductive line.

10. A packaged semiconductor device, comprising:
    a singulated integrated circuit die comprising a semiconductor substrate having top and bottom surfaces, said substrate comprising an integrated circuit formed in a device region at said top surface;
    a plurality of trench openings comprising at least one dummy trench opening formed at least partially through said substrate from said bottom surface;
    a leadframe coupled to a bottom surface of said substrate with a substantially continuous adhesive layer disposed over said bottom surface and within the trench openings, said adhesive layer forming a substantially continuous adhesion interface between the bottom surface of said substrate and an opposing mating surface of said leadframe; and
    a packaging material overmolded onto said singulated integrated circuit die and leadframe.

11. The semiconductor device of claim 10, further comprising a second layer of material disposed within said dummy trench, said adhesive layer disposed over said second layer of material.

12. The semiconductor device of claim 11, wherein said second layer of material partially fills said dummy trench, said adhesive layer filling a remaining portion of said dummy trench.

13. The semiconductor device of claim 12, wherein said second layer of material comprises copper and said adhesive layer comprises solder or a conductive paste comprising Ag.

14. The semiconductor device of claim 10, wherein said adhesive layer at least partially fills said dummy trench.

15. The semiconductor device of claim 10, wherein said at least one dummy trench is formed only partially through said substrate.

16. The semiconductor device of claim 10:
wherein the integrated circuit comprises an interconnect structure comprising a plurality of levels of metallization formed over said device region of said semiconductor substrate;
the semiconductor device further comprising a second integrated circuit die comprising a second semiconductor substrate having top and bottom surfaces, said second substrate comprising a second integrated circuit formed in a device region at the top surface, said second semiconductor substrate disposed over said interconnect structure;
at least one dummy trench opening formed at least partially through said second semiconductor substrate;
a second adhesive layer disposed between said bottom surface of said second semiconductor substrate and said interconnect structure, said second adhesive layer disposed at least partially within said dummy trench of said second semiconductor substrate.

17. A semiconductor package assembly comprising:
a first singulated chip having a first semiconductor substrate having top and bottom surfaces, said substrate comprising an integrated circuit formed in a device region at said top surface, at least one trench opening connecting to the device region through the semiconductor substrate and having at least one layer of conductive material deposited therein, and at least one dummy trench defined in said semiconductor substrate;
a leadframe coupled to said first chip with said at least one layer of conductive material, said at least one layer of conductive material at least partially filling said trenches and being disposed between a bottom surface of said substrate and an opposing mating surface of said leadframe, said conductive material forming a substantially continuous adhesion interface between the bottom surface of the substrate and the opposing mating surface of said leadframe;
a second singulated chip disposed over said first chip and electrically coupled to said leadframe through said first chip; and
a packaging material overmolded onto said first and second singulated chips and said leadframe.

18. The semiconductor package assembly of claim 17, wherein said leadframe comprises a conductive substrate, a die pad or a metal leadframe.

* * * * *